(12) United States Patent
Kim et al.

(10) Patent No.: US 10,784,839 B2
(45) Date of Patent: Sep. 22, 2020

(54) HIGH PASS FILTER

(71) Applicant: Samsung Electro-Mechanics Co., Ltd., Suwon-si (KR)

(72) Inventors: Jeong Hae Kim, Suwon-si (KR); Seong Jong Cheon, Suwon-si (KR); Hyung Jin Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 50 days.

(21) Appl. No.: 16/180,495

(22) Filed: Nov. 5, 2018

(65) Prior Publication Data

US 2019/0326883 A1    Oct. 24, 2019

(30) Foreign Application Priority Data

Apr. 20, 2018   (KR) .......................... 10-2018-0046358

(51) Int. Cl.
*H03H 9/54*     (2006.01)
*H03H 7/01*     (2006.01)
*H03H 9/60*     (2006.01)

(52) U.S. Cl.
CPC .......... *H03H 9/542* (2013.01); *H03H 7/0115* (2013.01); *H03H 7/1725* (2013.01); *H03H 7/1758* (2013.01); *H03H 9/54* (2013.01); *H03H 9/605* (2013.01); *H03H 7/1766* (2013.01)

(58) Field of Classification Search
CPC .... H03H 9/542; H03H 7/1758; H03H 7/1725; H03H 7/0115; H03H 9/605; H03H 7/1766; H03H 9/54
USPC ......................... 333/133, 187, 188, 193–196
See application file for complete search history.

(56) References Cited

U.S. PATENT DOCUMENTS 5,963,113 A  * 10/1999  Ou ....................... H03H 9/6463
                                                              333/193
2016/0218696 A1    7/2016  Nosaka
2017/0294896 A1   10/2017  Nosaka

FOREIGN PATENT DOCUMENTS

DE      102007033233 A1 *  1/2009 ............. H03H 9/542
KR      10-2016-0091261 A   8/2016
KR      10-2017-0097740 A   8/2017

OTHER PUBLICATIONS

Machine English Translation of DC102007033233 Published on Jan. 2009 (Year: 2009).*

* cited by examiner

*Primary Examiner* — Robert J Pascal
*Assistant Examiner* — Jorge L Salazar, Jr.
(74) *Attorney, Agent, or Firm* — NSIP Law

(57) ABSTRACT

A high pass filter includes: a first resonant circuit including an inductor and a capacitor in parallel between first and second terminals; a second resonant circuit including an inductor and a capacitor in series between a first end of the first resonant circuit and a ground; a third resonant circuit including an inductor and a capacitor in series between a second end of the first resonant circuit and the ground; a fourth resonant circuit disposed between the first end of the first resonant circuit and the first terminal, and including a first acoustic resonator; and a fifth resonant circuit disposed between the second end of the first resonant circuit and the second terminal, and including a second acoustic resonator. Attenuation regions respectively formed by the first, second, and third resonant circuits are arranged in lower frequency regions than attenuation regions respectively formed by the fourth and fifth resonant circuits.

16 Claims, 2 Drawing Sheets

HIGH PASS FILTER

CROSS-REFERENCE TO RELATED APPLICATIONS

This application claims benefit under 35 U.S.C. § 119(a) of Korean Patent Application No. 10-2018-0046358 filed on Apr. 20, 2018 in the Korean Intellectual Property Office, the entire disclosure of which is incorporated herein by reference for all purposes.

BACKGROUND

1. Field

The following description relates to a high pass filter.

2. Description of Related Art

With the development of mobile communication devices, chemical and biological devices, and the like, consumption of a small, lightweight filter, an oscillator, a resonant element, an acoustic resonant mass sensor and other elements used in such devices has increased recently.

A film bulk acoustic resonator (FBAR) has generally been used as a means to implement a small, lightweight filter, an oscillator, a resonant element, an acoustic resonant mass sensor, and the like. An FBAR is able to be mass-produced with minimal cost and may be miniaturized. An FBAR is also capable of implementing a high quality factor (Q), one of the main properties of a filter, and is able to be used in a micro-frequency band. Particularly, an FBAR is capable of implementing a personal communications service (PCS) band and a digital cordless system (DCS) band.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a high pass filter includes: a first resonant circuit including an inductor and a capacitor disposed in parallel in a signal line connecting a first terminal and a second terminal; a second resonant circuit including an inductor and a capacitor disposed in series between a first end of the first resonant circuit and a ground; a third resonant circuit including an inductor and a capacitor disposed in series between a second end of the first resonant circuit and the ground; a fourth resonant circuit disposed between the first end of the first resonant circuit and the first terminal, and including a first acoustic resonator having a first resonant frequency and a first antiresonant frequency; and a fifth resonant circuit disposed between the second end of the first resonant circuit and the second terminal, and including a second acoustic resonator having a second resonant frequency and a second antiresonant frequency, wherein attenuation regions respectively formed by the first resonant circuit, the second resonant circuit, and the third resonant circuit are arranged in lower frequency regions than attenuation regions respectively formed by the fourth resonant circuit and the fifth resonant circuit.

The attenuation regions formed by the fourth resonant circuit and the fifth resonant circuit may be formed by resonant frequencies of the first and second acoustic resonators.

The attenuation region formed by the fourth resonant circuit may be formed in a lower region than the attenuation region formed by the fifth resonant circuit.

The first resonant frequency may compensate for the second antiresonant frequency.

The first resonant frequency may be between the second resonant frequency and the second antiresonant frequency.

The first resonant frequency may be determined by:

$$fr4 = fr5 - (fr5 - fa5)*a,$$

wherein fr4 is the first resonant frequency, fr5 is the second resonant frequency, fa5 is the second antiresonant frequency, and a is a value greater than or equal to ¼ and less than or equal to ⅓.

At least one of the first resonant circuit, the second resonant circuit, and the third resonant circuit may compensate for an the first antiresonant frequency.

One of resonance frequencies of the first resonant circuit, the second resonant circuit, and the third resonant circuit may be in a frequency band that is 3% to 5% lower than the first antiresonant frequency.

The first and second acoustic resonators may be film bulk acoustic resonators.

In another general aspect, a high pass filter includes: a first LC resonant circuit disposed in a signal line connecting a first terminal and a second terminal; a second LC resonant disposed between a first end of the first LC resonant circuit and a ground; a third LC resonant circuit disposed between a second end of the first resonant circuit and the ground; a first acoustic resonator disposed between the first end of the first LC resonant circuit and the first terminal, and including a first resonant frequency and a first antiresonant frequency; and a second acoustic resonator disposed between the second end of the first LC resonant circuit and the second terminal, and including an acoustic resonator having a second resonant frequency and a second antiresonant frequency, wherein the first resonant frequency compensates for the second antiresonant frequency.

The first resonant frequency may be between the second resonant frequency and the second antiresonant frequency.

The first resonant frequency may be determined by:

$$fr4 = fr5 - (fr5 - fa5)*a,$$

wherein fr4 is the first resonant frequency, fr5 is the second resonant frequency, fa5 is the second antiresonant frequency, and a is a value greater than or equal to ¼ and less than or equal to ⅓.

At least one of the first LC resonant circuit, the second LC resonant circuit, and the third LC resonant circuit may compensate for the first antiresonant frequency.

One of resonant frequencies of the first LC resonant circuit, the second LC resonant circuit, and the third LC resonant circuit may be formed in a frequency band that is 3% to 5% lower than the first antiresonant frequency.

Attenuation regions respectively formed by the first LC resonant circuit, the second LC resonant circuit, and the third LC resonant circuit may be arranged in lower frequency regions than attenuation regions respectively formed by the first acoustic resonator and the second acoustic resonator.

The first and second acoustic resonators may be a film bulk acoustic resonator.

An attenuation region formed by the first LC resonant circuit may be arranged in a higher frequency region than an attenuation region formed by the second LC resonant circuit. An attenuation region formed by the third LC resonant circuit may be arranged in a higher frequency region than the attenuation region formed by the first LC resonant circuit. An attenuation region formed by the first acoustic resonator may be arranged in a higher frequency region than the attenuation region formed by the third LC resonant circuit. An attenuation region formed by the second acoustic resonator may be arranged in a higher frequency region than the attenuation region formed by the first acoustic resonator.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
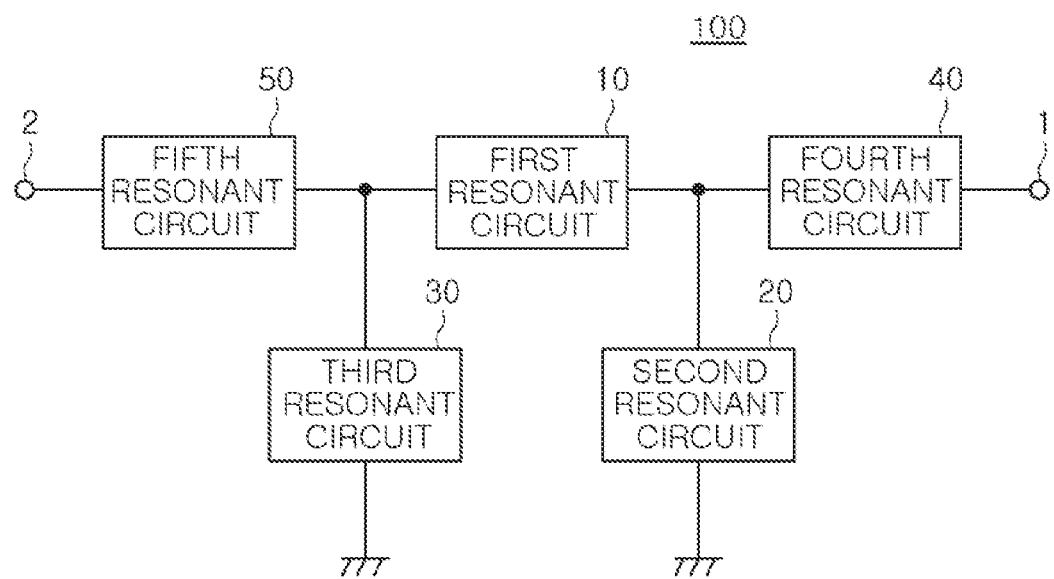
FIG. 1 is a block view of a high pass filter, according to an embodiment.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

Herein, it is noted that use of the term "may" with respect to an example or embodiment, e.g., as to what an example or embodiment may include or implement, means that at least one example or embodiment exists in which such a feature is included or implemented while all examples and embodiments are not limited thereto.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
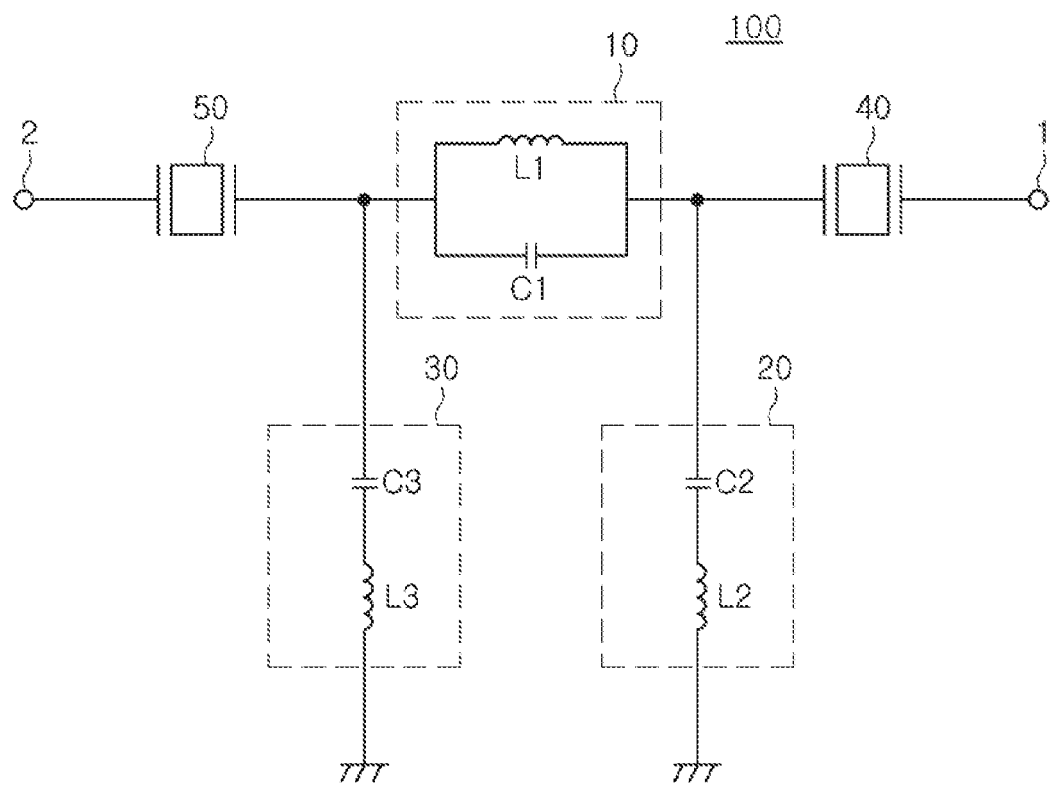
FIG. 2 is a circuit view of a high pass filter, according to an embodiment.

FIG. 1 is a block view of a high pass filter 100, according to an example. FIG. 2 is a circuit view of the high pass filter 100, according to an example.

Referring to FIGS. 1 and 2, the high pass filter 100 may have a first terminal 1 and a second terminal 2. The high pass filter 100 may include a first resonant circuit 10, a second resonant circuit 20, a third resonant circuit 30, a fourth resonant circuit 40, and a fifth resonant circuit 50.

The first resonant circuit 10 may be disposed in a signal line connecting the first terminal 1 and the second terminal 2, the second resonant circuit 20 may be disposed between one end of the first resonant circuit 10 and a ground, and the third resonant circuit 30 may be disposed between the other end of the first resonant circuit 10 and the ground.

The first resonant circuit 10 may include a first LC resonant circuit including an inductor L1 and a capacitor C1, which are connected to each other in parallel. The second resonant circuit 20 may include a second LC resonant circuit including an inductor L2 and a capacitor C2, which are connected to each other in series. The third resonant circuit 30 may include a third LC resonant circuit including an inductor L3 and a capacitor C3, which are connected to each other in series.

The fourth resonant circuit 40 may include a first acoustic resonator disposed between the first terminal 1 and the one end of the first resonant circuit 10, and the fifth resonant circuit 50 may include a second acoustic resonator disposed between the second terminal 2 and the other end of the first resonant circuit 20. That is, the first acoustic resonator of the fourth resonant circuit 40 may be disposed between the first terminal 1 and the second resonant circuit 20, and the second acoustic resonator of the fifth resonant circuit 50 may be disposed between the second terminal 2 and the third resonant circuit 30. Each of the first acoustic resonator and the second acoustic resonator may include a film bulk acoustic resonator (FBAR). Accordingly, the fourth resonant circuit 40 and the fifth resonant circuit 50 may each have a resonant frequency and an antiresonant frequency.

Figure 3:
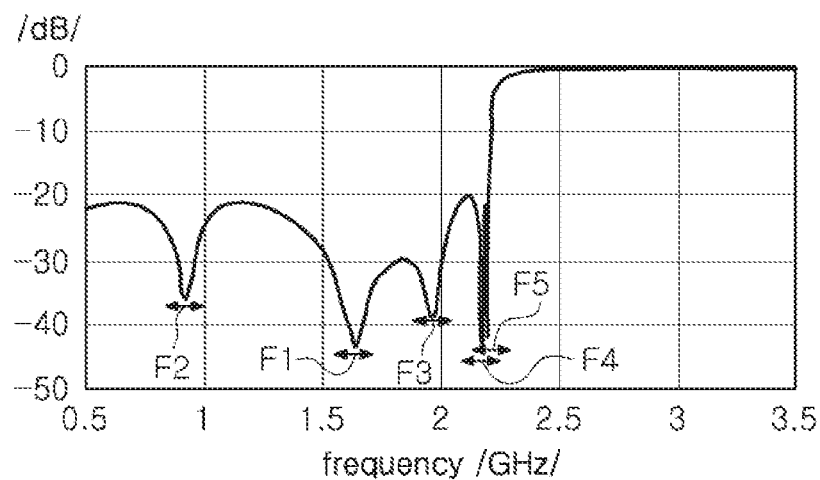
FIG. 3 is a graph illustrating filter properties of a high pass filter, according to an embodiment.
Figure 4:
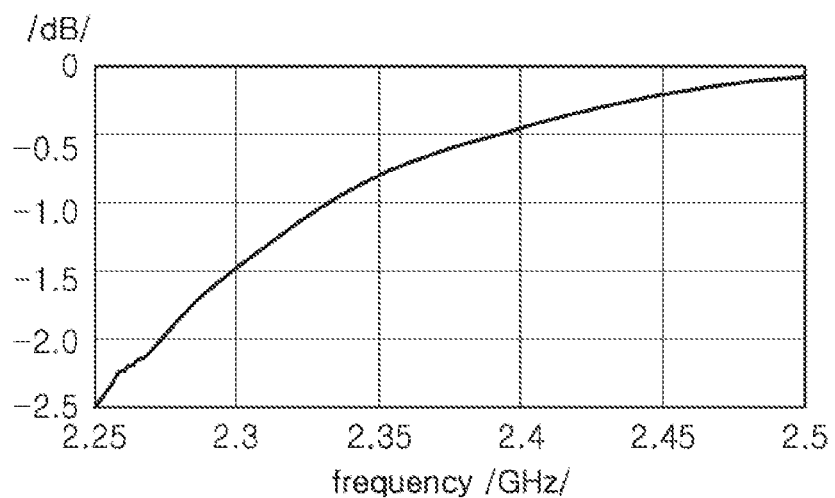
FIG. 4 is a magnified view illustrating insertion loss properties among the filter properties in FIG. 3.
Figure 5:
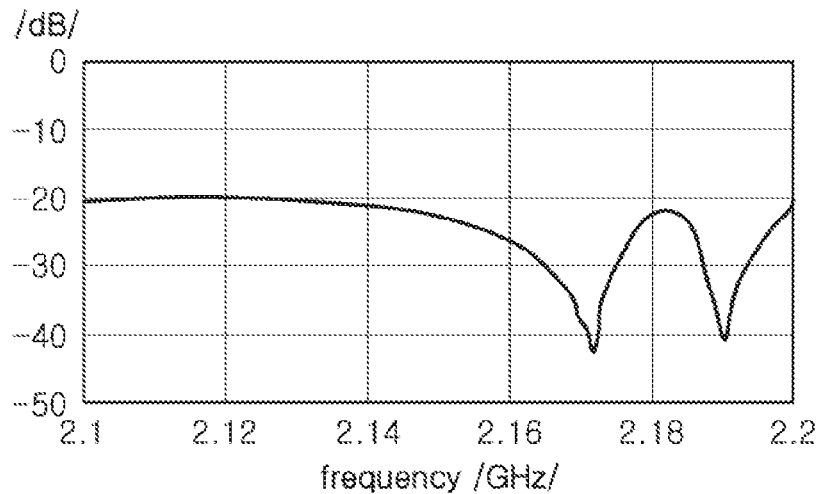
FIG. 5 is a magnified view illustrating attenuation properties among the filter properties in FIG. 3.

FIG. 3 is a graph illustrating filter properties of a high pass filter, according to an example. FIG. 4 is a magnified view illustrating insertion loss properties among the filter properties in FIG. 3. FIG. 5 is a magnified view illustrating attenuation properties among the filter properties in FIG. 3.

Referring to FIG. 3, a first attenuation region F1, a second attenuation region F2, a third attenuation region F3, a fourth attenuation region F4, and a fifth attenuation region F5 may be formed by a high pass filter.

The first attenuation region F1 may be arranged in a higher frequency region than the second attenuation region F2. The third attenuation region F3 may be arranged in a higher frequency region than the first attenuation region F1. The fourth attenuation region F4 may be arranged in a higher frequency region than the third attenuation region F3. The the fifth attenuation region F5 may be arranged in a higher frequency region than the fourth attenuation region F4.

The first attenuation region F1 may be formed by the first resonant circuit 10. The second attenuation region F2 may be formed by the second resonant circuit 20. The third attenuation region F3 may be formed by the third resonant circuit 30. The fourth attenuation region F4 may be formed by the fourth resonant circuit 40. The fifth attenuation region F5 may be formed by the fifth resonant circuit 50.

In the case in which the inductor L1 and the capacitor C1 of the first resonant circuit 10, which are connected to each other in parallel, resonate in parallel, a signal transferred between the first terminal and the second terminal may be blocked. Accordingly, the first resonant circuit 10 may form the first attenuation region F1 by a parallel LC resonation.

In the case in which the inductor L2 and the capacitor C2 of the second resonant circuit, which are connected in series, resonate in series, a signal transferred between the first terminal and the second terminal may be bypassed to a ground. Accordingly, the second resonate circuit 20 may form the second attenuation region F2 by a serial LC resonance.

In the case in which the inductor L3 and the capacitor C3 of the third resonant circuit 30, which are connected to each other in series, resonate in series, a signal transferred between the first terminal and the second terminal may be bypassed to a ground. Thus, the third resonant circuit 30 may form the third attenuation region F3 by a serial LC resonance.

The fourth attenuation region F4 may be formed by a resonant frequency of the fourth resonant circuit 40. The fifth attenuation region F5 may be formed by a resonant frequency of the fifth resonant circuit 50.

As described above, as the fourth resonant circuit 40 and the fifth resonant circuit 50 are configured by a film bulk acoustic resonator, the fourth resonant circuit 40 and the fifth resonant circuit 50 may each have an antiresonant frequency along with a resonant frequency.

However, there may be a problem of degradation of attenuation properties by an antiresonant frequency formed in a frequency band that is lower than a resonant frequency by 3.5% to 4%.

According to an example, the degradation of attenuation properties caused by an antiresonant frequency of the fifth resonant circuit 50 may be compensated by a resonant frequency of the fourth resonant circuit 40.

For example, the resonant frequency of the fourth resonant circuit 40 may be determined by Equation 1 as below. In Equation 1, fr5 may be a resonant frequency of the fifth resonant circuit 50, fa5 may be an antiresonant frequency of the fifth resonant circuit 50, and fr4 may be a resonant frequency of the fourth resonant circuit 40, and a may be a value between ¼ and ⅓. That is, a may be a value greater than or equal to ¼ and less than or equal to ⅓.

$$fr4 = fr5 - (fr5 - fa5)*a, \qquad \text{Equation 1}$$

Referring to Equation 1 above, by arranging a resonant frequency of the fourth resonant circuit 40 at a point between ¼ and ⅓ of an interval of a resonant frequency and an antiresonant frequency of the fifth resonant circuit 50, the degradation of attenuation properties caused by an antiresonant frequency of the fifth resonant circuit 50 may be compensated.

Also, according to the example, the degradation of attenuation properties caused by an antiresonant frequency of the fourth resonant circuit 40 may be compensated by a resonant frequency of the first resonant circuit 10, the second resonant circuit 20, and the third resonant circuit 30.

Specifically, by forming a resonant frequency of the third resonant circuit 30 in a frequency band that is 3% to 5% lower than an antiresonant frequency of the fourth resonant circuit 40, the degradation of attenuation properties caused by an antiresonant frequency of the fourth resonant circuit 40 may be primarily compensated. Also, an attenuation of a resonant frequency of the first and second resonant circuits 10 and 20 that is similar to the attenuation of the resonant frequency of the third resonant circuit 30 may be applied to an anti-frequency of the fourth resonant circuit 40, and accordingly, the degradation of attenuation properties caused by an antiresonant frequency of the fourth resonant circuit 40 may be secondarily compensated.

According to the examples described above, a pass band and a rejection band may have a rapid tendency difference due to the fourth attenuation region F4 formed by a resonant frequency of the fourth resonant circuit 40 and the fifth attenuation region F5 formed by a resonant frequency of the fifth resonant circuit 50. Thus, a high pass filter according to the example may have sufficient attenuation properties, and may have an excellent performance of −1 dB of less insertion loss.

According to the examples disclosed herein, a high pass filter may have excellent attenuation properties and insertion loss properties.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A high pass filter, comprising:
   a first resonant circuit comprising an inductor and a capacitor disposed in parallel in a signal line connecting a first terminal and a second terminal;

a second resonant circuit comprising an inductor and a capacitor disposed in series between a first end of the first resonant circuit and a ground;

a third resonant circuit comprising an inductor and a capacitor disposed in series between a second end of the first resonant circuit and the ground;

a fourth resonant circuit disposed between the first end of the first resonant circuit and the first terminal, and comprising a first acoustic resonator having a first resonant frequency and a first antiresonant frequency; and a fifth resonant circuit disposed between the second end of the first resonant circuit and the second terminal, and comprising a second acoustic resonator having a second resonant frequency and a second antiresonant frequency, wherein attenuation regions respectively formed by the first resonant circuit, the second resonant circuit, and the third resonant circuit are arranged in frequency regions lower than attenuation regions respectively formed by the fourth resonant circuit and the fifth resonant circuit.

2. The high pass filter of claim 1, wherein the attenuation regions formed by the fourth resonant circuit and the fifth resonant circuit are formed by resonant frequencies of the first and second acoustic resonators.

3. The high pass filter of claim 1, wherein the attenuation region formed by the fourth resonant circuit is formed in a second frequency region lower than the attenuation region formed by the fifth resonant circuit.

4. The high pass filter of claim 1, wherein the first resonant frequency compensates for the second antiresonant frequency.

5. The high pass filter of claim 4, wherein the first resonant frequency is between the second resonant frequency and the second antiresonant frequency.

6. The high pass filter of claim 5, wherein the first resonant frequency is determined by:

$$fr4=fr5-(fr5-fa5)*\alpha,$$

wherein fr4 is the first resonant frequency, fr5 is the second resonant frequency, fa5 is the second antiresonant frequency, and a is a value greater than or equal to ¼ and less than or equal to ⅓.

7. The high pass filter of claim 1, wherein any one or any combination of any two or more of the first resonant circuit, the second resonant circuit, and the third resonant circuit compensates for the first antiresonant frequency.

8. The high pass filter of claim 7, wherein one of resonance frequencies of the first resonant circuit, the second resonant circuit, and the third resonant circuit is in a frequency band that is 3% to 5% lower than the first antiresonant frequency.

9. The high pass filter of claim 1, wherein the first and second acoustic resonators comprise film bulk acoustic resonators.

10. A high pass filter, comprising:
a first LC resonant circuit disposed in a signal line connecting a first terminal and a second terminal;
a second LC resonant circuit disposed between a first end of the first LC resonant circuit and a ground;
a third LC resonant circuit disposed between a second end of the first resonant circuit and the ground;
a first acoustic resonator disposed between the first end of the first LC resonant circuit and the first terminal, and comprising a first resonant frequency and a first antiresonant frequency; and a second acoustic resonator disposed between the second end of the first LC resonant circuit and the second terminal, and comprising an acoustic resonator having a second resonant frequency and a second antiresonant frequency, wherein the first resonant frequency compensates for the second antiresonant frequency, and wherein the first resonant frequency is between the second resonant frequency and the second antiresonant frequency.

11. The high pass filter of claim 10, wherein an attenuation region formed by the first LC resonant circuit is arranged in a higher frequency region than an attenuation region formed by the second LC resonant circuit, an attenuation region formed by the third LC resonant circuit is arranged in a higher frequency region than the attenuation region formed by the first LC resonant circuit, an attenuation region formed by the first acoustic resonator is arranged in a higher frequency region than the attenuation region formed by the third LC resonant circuit, and an attenuation region formed by the second acoustic resonator is arranged in a higher frequency region than the attenuation region formed by the first acoustic resonator.

12. The high pass filter of claim 10, wherein the first resonant frequency is determined by:

$$fr4=fr5-(fr5-fa5)*\alpha, \text{ and}$$

wherein fr4 is the first resonant frequency, fr5 is the second resonant frequency, fa5 is the second antiresonant frequency, and a is a value greater than or equal to ¼ and less than or equal to ⅓.

13. The high pass filter of claim 10, wherein any one or any combination of any two or more of the first LC resonant circuit, the second LC resonant circuit, and the third LC resonant circuit compensates for the first antiresonant frequency.

14. The high pass filter of claim 13, wherein one of resonant frequencies of the first LC resonant circuit, the second LC resonant circuit, and the third LC resonant circuit is formed in a frequency band that is 3% to 5% lower than the first antiresonant frequency.

15. The high pass filter of claim 10, wherein the first and second acoustic resonators comprise film bulk acoustic resonators.

16. A high pass filter, comprising:
a first LC resonant circuit disposed in a signal line connecting a first terminal and a second terminal;
a second LC resonant circuit disposed between a first end of the first LC resonant circuit and a ground;
a third LC resonant circuit disposed between a second end of the first resonant circuit and the ground;
a first acoustic resonator disposed between the first end of the first LC resonant circuit and the first terminal, and comprising a first resonant frequency and a first antiresonant frequency; and
a second acoustic resonator disposed between the second end of the first LC resonant circuit and the second terminal, and comprising an acoustic resonator having a second resonant frequency and a second antiresonant frequency, wherein the first resonant frequency compensates for the second antiresonant frequency, and wherein attenuation regions respectively formed by the first LC resonant circuit, the second LC resonant circuit, and the third LC resonant circuit are arranged in lower frequency regions than attenuation regions respectively formed by the first acoustic resonator and the second acoustic resonator.

* * * * *